United States Patent
Huang et al.

(10) Patent No.: US 10,347,981 B1
(45) Date of Patent: Jul. 9, 2019

(54) SENSOR HAVING SEPARATE ANTENNA

(71) Applicant: IR-TEC INTERNATIONAL LTD., Taoyuan (TW)

(72) Inventors: Wei-I Huang, Taoyuan (TW); Shih-Tsung Lin, Taoyuan (TW); Wen-Hsiang Wang, Taoyuan (TW)

(73) Assignee: IR-Tec International Ltd., Taoyuan (TW)

( * ) Notice: Subject to any disclaimer, the term of this patent is extended or adjusted under 35 U.S.C. 154(b) by 30 days.

(21) Appl. No.: 15/869,340

(22) Filed: Jan. 12, 2018

(51) Int. Cl.
| | |
|---|---|
| *G01D 11/24* | (2006.01) |
| *H01Q 1/42* | (2006.01) |
| *H05K 7/14* | (2006.01) |
| *H05K 5/03* | (2006.01) |
| *H01Q 1/36* | (2006.01) |
| *G01J 1/42* | (2006.01) |

(52) U.S. Cl.
CPC ............ *H01Q 1/42* (2013.01); *G01D 11/245* (2013.01); *H01Q 1/36* (2013.01); *H05K 5/03* (2013.01); *H05K 7/1427* (2013.01); *G01J 1/4204* (2013.01)

(58) Field of Classification Search
CPC ........ H01Q 1/42; G01D 11/245; G01D 11/24; H05K 5/03
See application file for complete search history.

(56) References Cited

U.S. PATENT DOCUMENTS

| | | | | | |
|---|---|---|---|---|---|
| 8,328,582 | B1* | 12/2012 | Carley | ................... | H01R 33/94 439/642 |
| 9,281,639 | B2* | 3/2016 | Yang | ...................... | H01R 24/40 |
| 2011/0189889 | A1* | 8/2011 | Wang | ....................... | H01R 9/05 439/578 |
| 2017/0146395 | A1* | 5/2017 | Huang | .................. | G01J 1/0219 |

* cited by examiner

*Primary Examiner* — Jamel E Williams
(74) *Attorney, Agent, or Firm* — Rosenberg, Klein & Lee

(57) ABSTRACT

A sensor having a separate antenna includes a shell, a circuit board, a nameplate, an antenna, and a connecting unit. The shell includes a substrate and a tubular wall. The tubular wall is mounted on a first surface of the substrate to form a containing space. The circuit board is mounted in the containing space. The nameplate is mounted on a second surface of the substrate which is opposite the first surface. The antenna is mounted on the nameplate and is separate from the circuit board. The connecting unit is electrically connected between the antenna and the circuit board, and is mounted through the substrate. The antenna may be mounted outside of the containing space. When the sensor is mounted on a ceiling, the ceiling may not block wireless signals, and quality of wireless communication of the antenna may be improved.

20 Claims, 6 Drawing Sheets

SENSOR HAVING SEPARATE ANTENNA

BACKGROUND OF THE INVENTION

1. Field of the Invention

The present invention relates to a sensor, and particularly to a sensor having a separate antenna.

2. Description of the Related Art

A conventional sensor senses changes of the environmental condition, and provides a control signal according to the changes of the environmental condition. The conventional sensor may transmit the control signal to a device to control the device. For example, a sensor of a lamp may sense changes of luminance of the environmental light or a motion of an object.

When the luminance of the environmental light is changed or someone or something is moving within a detection range of the sensor, the sensor of the lamp may sense the changes of the environmental light, and the sensor of the lamp may transmit the control signal to the lamp to control the lamp. For example, when the sensor senses that the luminance of the environment becomes darker, the sensor controls the lamp to be brightened. When the sensor senses that someone or something is moving, the sensor controls the lamp to be turned on. When the sensor senses that someone or something remains unmoving for a preset time period, the sensor controls the lamp to be turned off. Therefore, the light may be automatically controlled.

The sensor may comprise control buttons to adjust range of light change or to adjust delay time of the lamp. For example, when the sensor senses that the luminance of the environmental light becomes darker, the sensor controls the lamp to increase or decrease brightness according to the range of the light change. When the sensor senses that someone or something is moving, the sensor controls the lamp to be turned on after the delay time of the light. When the sensor senses that someone or something remains unmoving for a preset time period, the sensor controls the light to be turned off after the delay time of the light. Therefore, misjudgment of the sensor may be avoided.

Further, the sensor may be remotely controlled by a remote controller. The remote controller communicates with the sensor through wireless communication technology, and the sensor may comprise an antenna to transmit or receive wireless signals through the wireless communication technology.

With reference to FIG. 6, the antenna 30 of the sensor is welded on a circuit board 40 of the sensor, or the antenna 30 may be a metal layer on the circuit board 40.

When the sensor is mounted in a ceiling or a wall of a building, since the antenna 30 is mounted on the circuit board 40 and the circuit board 40 may be mounted in a shell of the sensor, the antenna 30 may be embedded into the ceiling or the wall. Then, the circuit board 40 may not be damaged by external damage or sprinkled by water. When the circuit board is sprinkled by water, short circuit may occur and damage the circuit board. However, since the antenna 30 is embedded into the ceiling or the wall, the ceiling or the wall may block wireless signals of wireless communication of the antenna 30. Then, the antenna 30 may not clearly transmit or receive the wireless signals, and quality of the wireless communication of the antenna may be deteriorated. Therefore, the conventional sensor needs to be improved.

SUMMARY OF THE INVENTION

An objective of the present invention is to provide a sensor having a separate antenna to clearly transmit or receive wireless signals.

To achieve the foregoing objective, the sensor comprises a shell, a circuit board, a nameplate, an antenna, and a connecting unit.

The shell comprises a substrate and a tubular wall. The substrate comprises a first surface and a second surface, and the first surface is opposite the second surface. The tubular wall is mounted on the first surface of the substrate, and a containing space is formed within an inner surface of the tubular wall and the first surface of the substrate.

The circuit board is mounted in the containing space of the shell.

The nameplate is mounted on the second surface of the substrate of the shell.

The antenna is mounted on the nameplate and is separate from the circuit board.

The connecting unit is electrically connected between the antenna and the circuit board, and the connecting unit is mounted through the substrate of the shell.

Since the antenna is mounted on the nameplate and electrically connected to the circuit board through the connecting unit, the antenna may be mounted outside of the containing space of the shell. When the sensor is mounted on a ceiling or a wall of a building, the ceiling or the wall may not block wireless signals of wireless communication of the antenna, and the antenna may clearly transmit or receive the wireless signals. Therefore, quality of the wireless communication of the antenna may be increased.

Other objectives, advantages and novel features of the invention will become more apparent from the following detailed description when taken in conjunction with the accompanying drawings.

DETAILED DESCRIPTION OF THE INVENTION

Figure 1:
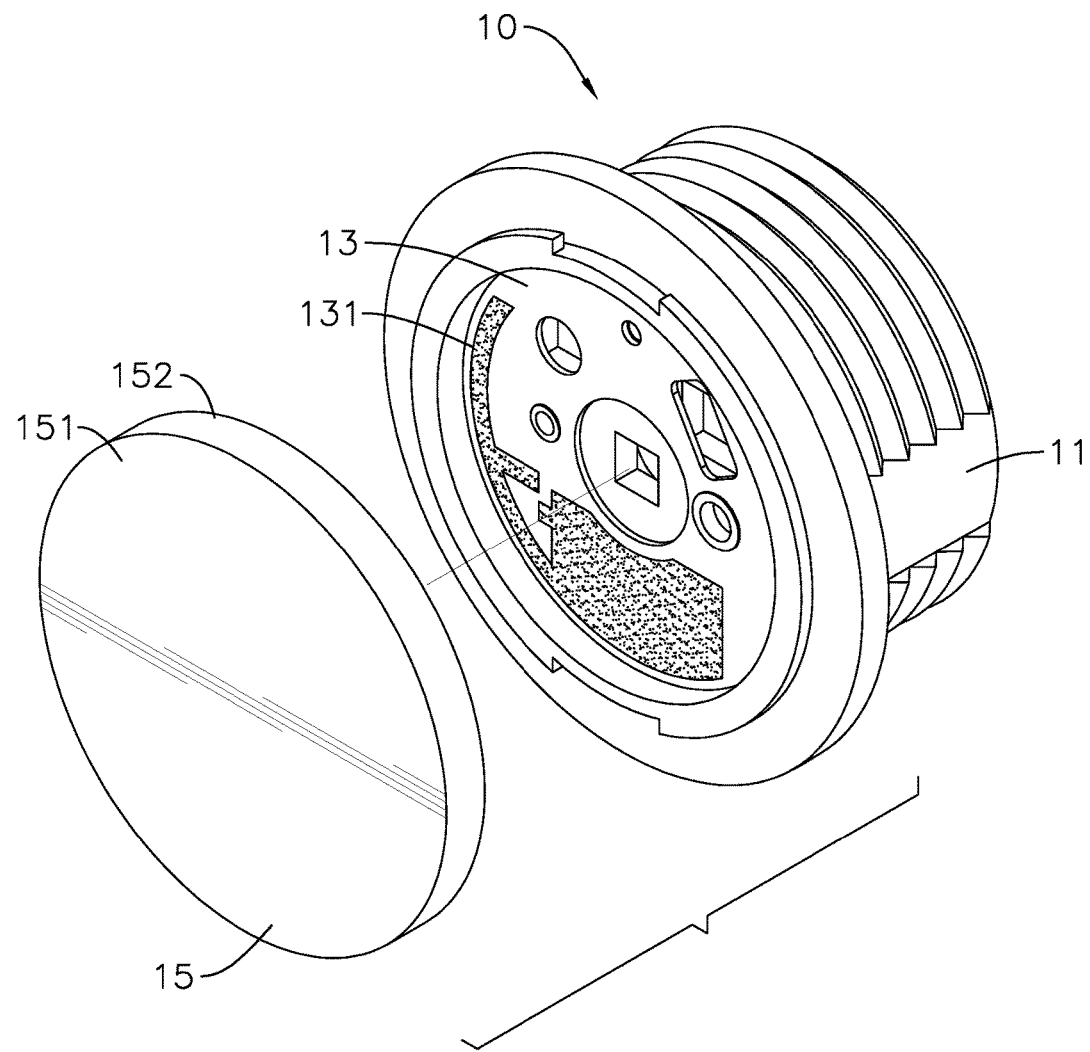
FIG. 1 is an exploded perspective view of an embodiment of a sensor having a separate antenna of the present application.
Figure 2:
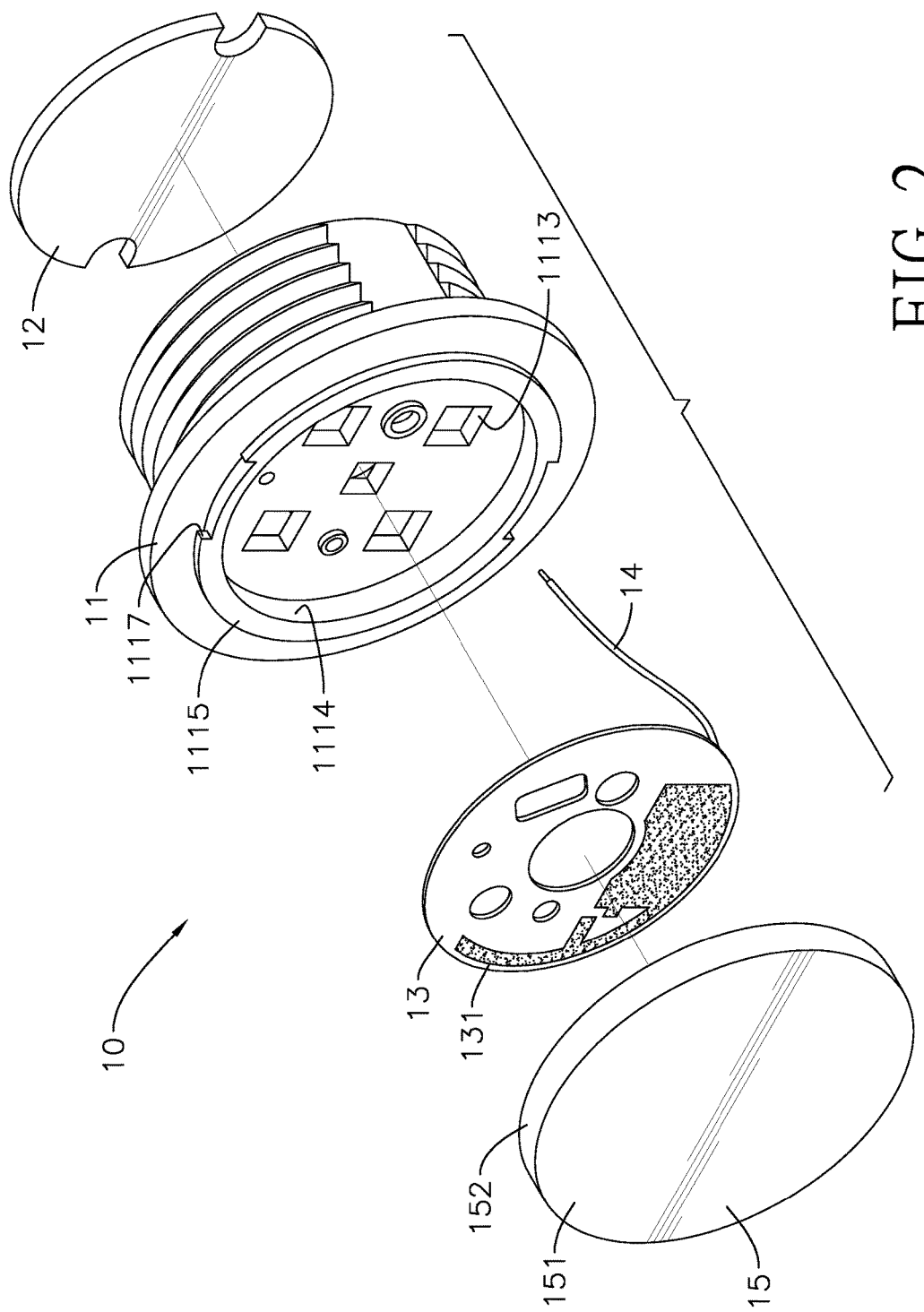
FIG. 2 is another exploded perspective view of the sensor of the present application.

With reference to FIGS. 1 and 2, an embodiment of the present invention is a sensor 10 having a separate antenna. The sensor 10 comprises a shell 11, a circuit board 12, a nameplate 13, an antenna 131, and a connecting unit 14.

Figure 3:
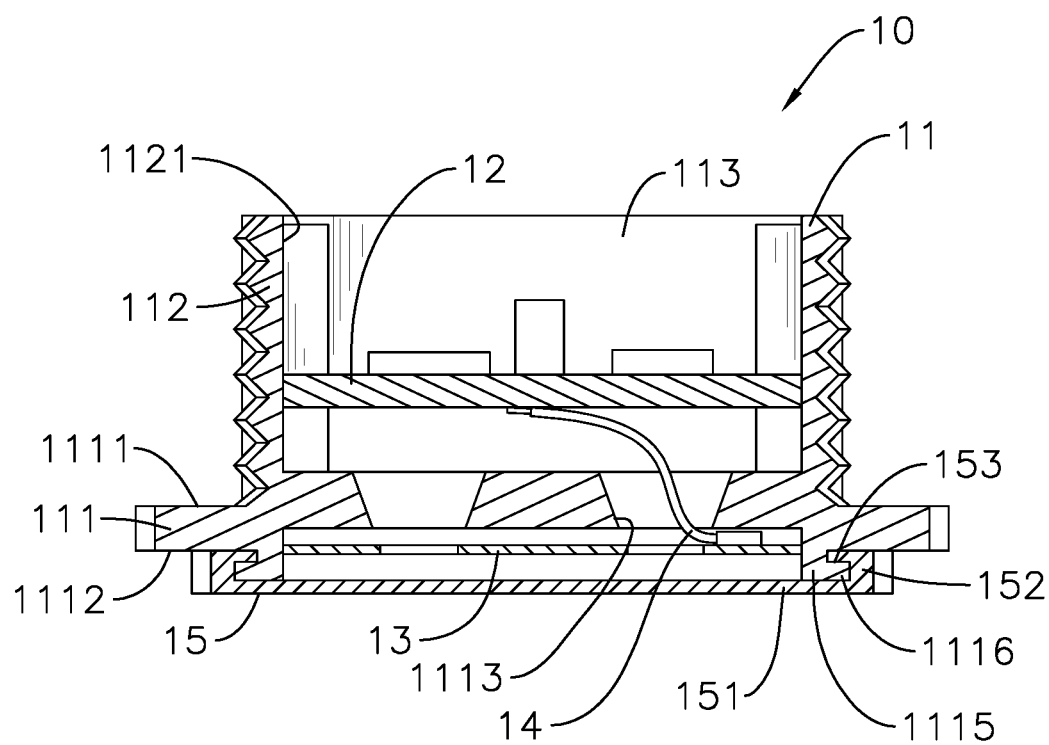
FIG. 3 is a sectional view of the sensor of FIG. 1.

With reference to FIG. 3, the shell 11 comprises a substrate 111 and a tubular wall 112. The substrate 111 comprises a first surface 1111 and a second surface 1112. The first surface 1111 is opposite the second surface 1112. The tubular wall 112 is mounted on the first surface 1111 of the substrate 111, and a containing space 113 is formed within an inner surface 1121 of the tubular wall 112 and the first surface 1111 of the substrate 111.

The circuit board 12 is mounted in the containing space 113 of the shell 11. As shown in FIGS. 1 and 2, the nameplate 13 is mounted on the second surface 1112 of the substrate 111 of the shell 11. The antenna 131 is mounted on the nameplate 13 and is separate from the circuit board 12.

The connecting unit 14 is electrically connected between the antenna 131 and the circuit board 12, and the connecting unit 14 is mounted through the substrate 111 of the shell 11. In the embodiment, the antenna 131 mounted on the nameplate 13 is mounted on a surface of the nameplate 13 which is opposite to the substrate 111 of the shell 11.

Figure 4:
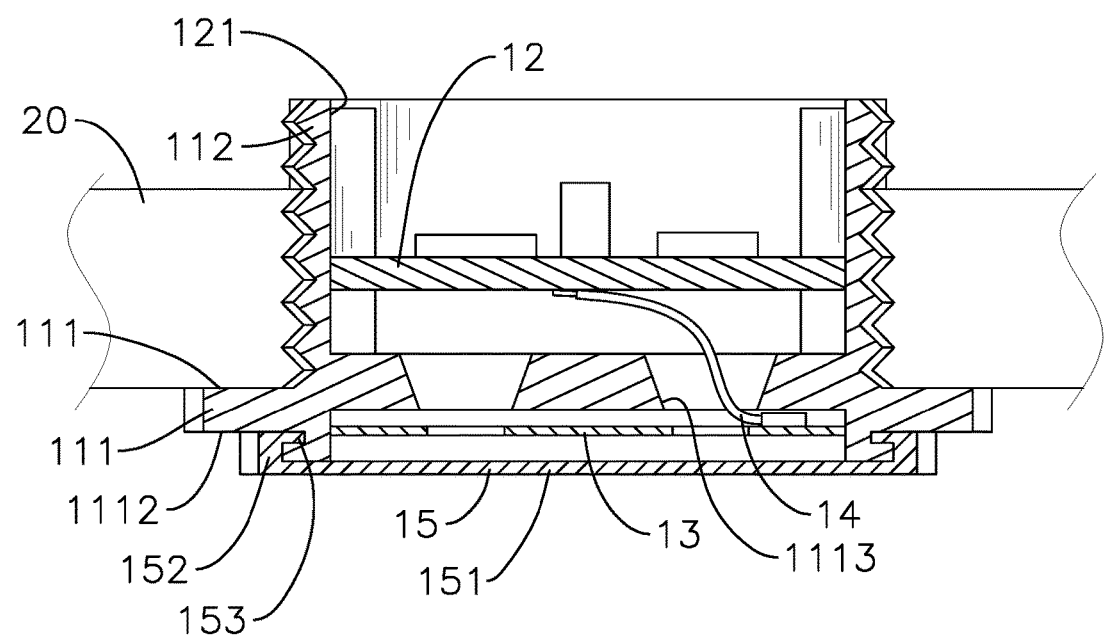
FIG. 4 is a schematic view of an embodiment of the sensor of FIG. 1 mounted on a ceiling.

With reference to FIG. 4, since the antenna 131 is mounted on the nameplate 13 and electrically connected to the circuit board 12 through the connecting unit 14, the antenna 131 may be mounted outside of the containing space 113 of the shell 11. The antenna 131 is mounted on the nameplate 13, and the nameplate 13 is mounted on the second surface 1112 of the substrate 111 of the shell 11. When the sensor 10 is mounted on a ceiling or a wall of a building, the ceiling or the wall may not block wireless signals of wireless communication of the antenna 131, and the antenna 131 may clearly transmit or receive the wireless signals. Therefore, quality of the wireless communication of the antenna 131 may be improved. In the embodiment, the sensor 10 is an embedded sensor.

In the embodiment, the substrate 111 has at least one through hole 1113, and the at least one through hole 1113 is formed through the first surface 1111 and the second surface 1112 of the substrate 111. The connecting unit 14 is mounted through the at least one through hole 1113. The second surface 1112 of the substrate 111 has a notch 1114, and the nameplate 13 is mounted in the notch 1114 of the second surface 1112 of the substrate 111.

The antenna 131 is a metal layer on the nameplate 13.

Figure 5:
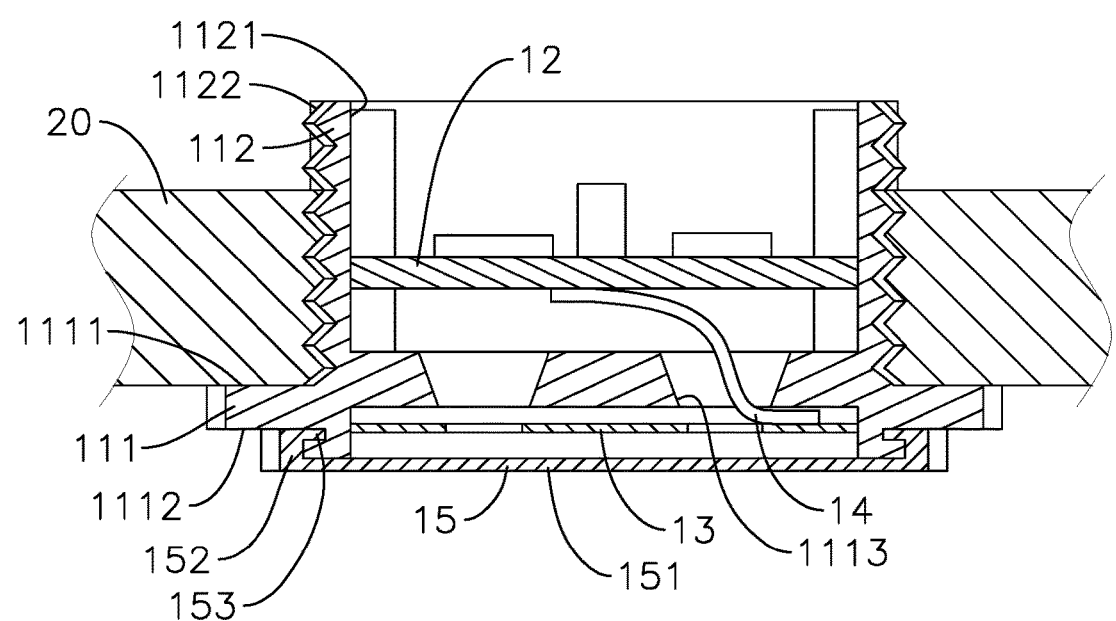
FIG. 5 is a schematic view of another embodiment of the sensor of FIG. 1 mounted on a ceiling.
Figure 6:
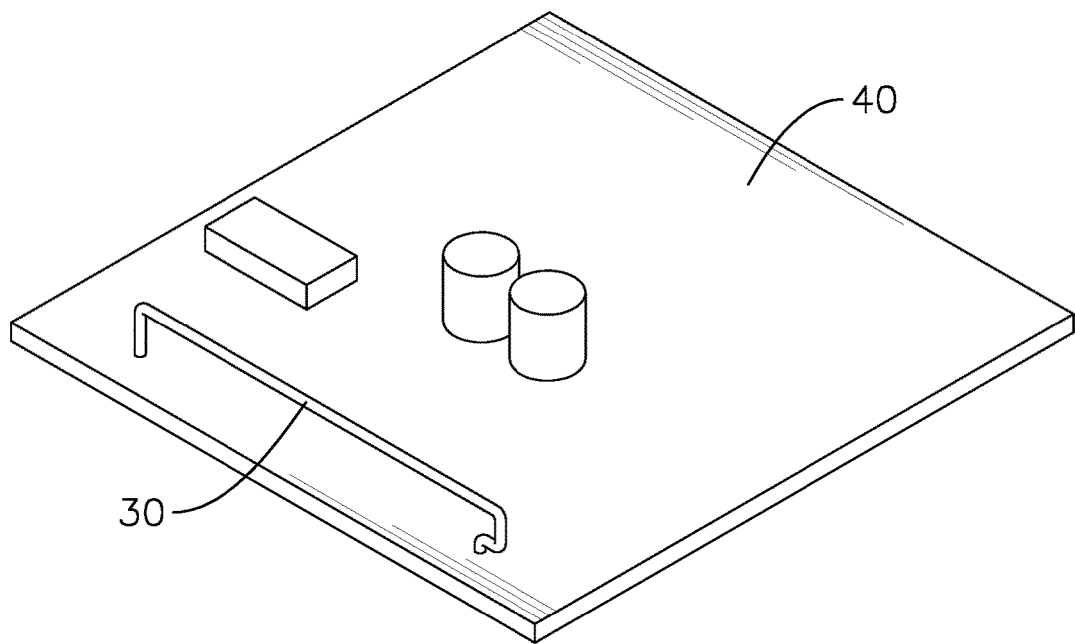
FIG. 6 is a schematic view of a conventional antenna of a sensor.

With reference to FIG. 4, the sensor 10 is mounted on a ceiling 20 or a wall of a building. In the embodiment, an exterior surface 1122 of the tubular wall 112 of the shell 11 forms external threads, and the sensor 10 may be screwed into the ceiling 20 or the wall of the building to be fixed on the ceiling 20 or the wall of the building. In the embodiment, the connecting unit 14 may be an electric wire, as shown in FIG. 4, or may be a contact spring, as shown in FIG. 5.

With reference to FIGS. 2 and 3, the sensor 10 further comprises a cover 15. The cover 15 is mounted on the second surface 1112 of the substrate 111 and covers the nameplate 13. Therefore, the cover 15 may protect the nameplate 13, and dust may not enter the sensor 10 to affect the circuit board 12.

The substrate 111 further comprises a first annular wall 1115 and an annular engaging portion 1116. The first annular wall 1115 axially extends from the second surface 1112 of the substrate 111 along an edge of the notch 1114. The annular engaging portion 1116 radially extends from an end of the first annular wall 1115, and the annular engaging portion 1116 comprises at least one gap 1117.

The cover 15 comprises a plate 151, a second annular wall 152, and at least one protrusion 153. The second annular wall 152 of the cover 15 is mounted on an edge of the plate 151 of the cover 15. The at least one protrusion 153 of the cover 15 is formed on an inner surface of the second annular wall 152 of the cover 15.

When the cover 15 is mounted on the second surface 1112 of the substrate 111, the at least one protrusion 153 of the cover 15 is aimed at the at least one gap 1117 of the annular engaging portion 1116 of the substrate 111 of the shell 11, and then the cover 15 is mounted on the second surface 1112 of the substrate 111 and is rotated. Therefore, the at least one protrusion 153 of the cover 15 may be engaged with the annular engaging portion 1116 of the substrate 111 of the shell 11, and the cover 15 may be firmly mounted on the shell 11.

Further, the antenna 131 mounted on the nameplate 13 is mounted on the surface of the nameplate 13 which is opposite to the substrate 111 of the shell 11. When the sensor 10 is a sensor of a lamp, the sensor 10 may transmit sensing signals to sense whether someone or something is moving within a detection range of the sensor. Since the sensor 10 extends out of a surface of the lamp, the sensing signals transmitted by the antenna 131 may not block by the lamp, and the sensor 10 may clearly sense whether someone or something is moving within the detection range.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A sensor, comprising:
    a shell, comprising:
        a substrate, comprising a first surface and a second surface opposite the first surface;
        a tubular wall, mounted on the first surface of the substrate; wherein a containing space is formed within an inner surface of the tubular wall and the first surface of the substrate;
    a circuit board, mounted in the containing space of the shell;
    a nameplate, mounted on the second surface of the substrate of the shell;
    an antenna, mounted on the nameplate and separate from the circuit board; and
    a connecting unit, electrically connected between the antenna and the circuit board, wherein the connecting unit is mounted through the substrate of the shell.

2. The sensor as claimed in claim 1, wherein:
    the substrate has at least one through hole formed through the first surface and the second surface of the substrate; and
    the connecting unit is mounted through the at least one through hole.

3. The sensor as claimed in claim 1, wherein:
    the second surface of the substrate has a notch; and
    the nameplate is mounted in the notch of the second surface of the substrate.

4. The sensor as claimed in claim 2, wherein:
    the second surface of the substrate has a notch; and
    the nameplate is mounted in the notch of the second surface of the substrate.

5. The sensor as claimed in claim 1, wherein:
    the antenna is a metal layer on the nameplate.

6. The sensor as claimed in claim 2, wherein:
    the antenna is a metal layer on the nameplate.

7. The sensor as claimed in claim 3, wherein:
    the antenna is a metal layer on the nameplate.

8. The sensor as claimed in claim 1, wherein:
an exterior surface of the tubular wall of the shell has external threads.
9. The sensor as claimed in claim 2, wherein:
an exterior surface of the tubular wall of the shell has external threads.
10. The sensor as claimed in claim 3, wherein:
an exterior surface of the tubular wall of the shell has external threads.
11. The sensor as claimed in claim 5, wherein:
an exterior surface of the tubular wall of the shell has external threads.
12. The sensor as claimed in claim 1, further comprising:
a cover, mounted on the second surface of the substrate and covering the nameplate.
13. The sensor as claimed in claim 12, wherein:
the substrate further comprises a first annular wall and an annular engaging portion;
the first annular wall axially extends from the second surface of the substrate along an edge of the notch;
the annular engaging portion radially extends from an end of the first annular wall, and comprises at least one gap;
the cover comprises a plate, a second annular wall, and at least one protrusion;
the second annular wall of the cover is mounted on an edge of the plate of the cover; and
the at least one protrusion of the cover is formed on an inner surface of the second annular wall of the cover.
14. The sensor as claimed in claim 2, further comprising:
a cover, mounted on the second surface of the substrate and covering the nameplate.
15. The sensor as claimed in claim 14, wherein:
the substrate further comprises a first annular wall and an annular engaging portion;
the first annular wall axially extends from the second surface of the substrate along an edge of the notch;
the annular engaging portion radially extends from an end of the first annular wall, and comprises at least one gap;
the cover comprises a plate, a second annular wall, and at least one protrusion;
the second annular wall of the cover is mounted on an edge of the plate of the cover; and
the at least one protrusion of the cover is formed on an inner surface of the second annular wall of the cover.
16. The sensor as claimed in claim 3, further comprising:
a cover, mounted on the second surface of the substrate and covering the nameplate.
17. The sensor as claimed in claim 16, wherein:
the substrate further comprises a first annular wall and an annular engaging portion;
the first annular wall axially extends from the second surface of the substrate along an edge of the notch;
the annular engaging portion radially extends from an end of the first annular wall, and comprises at least one gap;
the cover comprises a plate, a second annular wall, and at least one protrusion;
the second annular wall of the cover is mounted on an edge of the plate of the cover; and
the at least one protrusion of the cover is formed on an inner surface of the second annular wall of the cover.
18. The sensor as claimed in claim 5, further comprising:
a cover, mounted on the second surface of the substrate and covering the nameplate.
19. The sensor as claimed in claim 18, wherein:
the substrate further comprises a first annular wall and an annular engaging portion;
the first annular wall axially extends from the second surface of the substrate along an edge of the notch;
the annular engaging portion radially extends from an end of the first annular wall, and comprises at least one gap;
the cover comprises a plate, a second annular wall, and at least one protrusion;
the second annular wall of the cover is mounted on an edge of the plate of the cover;
the at least one protrusion of the cover is formed on an inner surface of the second annular wall of the cover.
20. The sensor as claimed in claim 8, further comprising:
a cover, mounted on the second surface of the substrate and covering the nameplate;
wherein
the substrate further comprises a first annular wall and an annular engaging portion;
the first annular wall axially extends from the second surface of the substrate along an edge of the notch;
the annular engaging portion radially extends from an end of the first annular wall, and comprises at least one gap;
the cover comprises a plate, a second annular wall, and at least one protrusion;
the second annular wall of the cover is mounted on an edge of the plate of the cover; and
the at least one protrusion of the cover is formed on an inner surface of the second annular wall of the cover.

* * * * *